United States Patent
Zhang

(10) Patent No.: US 10,665,793 B2
(45) Date of Patent: May 26, 2020

(54) PIXEL DEFINITION LAYER HAVING AN INCLINE FOR AN ORGANIC LIGHT EMITTING DEVICE

(71) Applicant: BOE TECHNOLOGY GROUP CO., LTD., Beijing (CN)

(72) Inventor: Wei Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/757,699

(22) PCT Filed: Jul. 14, 2017

(86) PCT No.: PCT/CN2017/092968
§ 371 (c)(1),
(2) Date: Mar. 6, 2018

(87) PCT Pub. No.: WO2018/086370
PCT Pub. Date: May 17, 2018

(65) Prior Publication Data
US 2019/0044077 A1 Feb. 7, 2019

(30) Foreign Application Priority Data
Nov. 14, 2016 (CN) .......................... 2016 1 0999302

(51) Int. Cl.
*H01L 29/08* (2006.01)
*H01L 33/00* (2010.01)
(Continued)

(52) U.S. Cl.
CPC ........ *H01L 51/0096* (2013.01); *H01L 27/124* (2013.01); *H01L 27/3246* (2013.01);
(Continued)

(58) Field of Classification Search
CPC ............... H01L 51/0096; H01L 27/124; H01L 27/3211; H01L 27/3246; H01L 51/5056;
(Continued)

(56) References Cited

U.S. PATENT DOCUMENTS 8,330,359 B2 * 12/2012 Yoshida .............. H01L 27/3246
313/504
9,029,838 B2 * 5/2015 Lim .................... H01L 51/5209
257/40
(Continued)

FOREIGN PATENT DOCUMENTS

CN 101202328 A 6/2008
CN 103219354 A 7/2013
(Continued)

OTHER PUBLICATIONS

Second Chinese Office Action dated Aug. 22, 2018.
Search Report and Written Opinion dated Sep. 27, 2017 from State Intellectual Property office of the P.R. China.

*Primary Examiner* — Alonzo Chambliss
(74) *Attorney, Agent, or Firm* — Dilworth & Barrese, LLP.; Michael J. Musella, Esq.

(57) ABSTRACT

A substrate for an organic light-emitting device, a method for manufacturing the substrate for an organic light-emitting device, and a display device are provided. The substrate for an organic light-emitting device includes a base substrate, a pixel definition layer on the base substrate, and an organic light-emitting device in each of the pixel regions. The pixel definition layer defines a plurality of pixel regions, each of the pixel regions has a top opening and a lower opening along a thickness direction of the base substrate, the lower opening is in the top opening so that each of the pixel regions has a slope extending from the top opening to the lower
(Continued)

opening, and boundaries of the top openings adjacent to each other are intersected with each other.

17 Claims, 7 Drawing Sheets

(51) Int. Cl.
| | | |
|---|---|---|
| H01L 31/0232 | (2014.01) | |
| H01L 21/00 | (2006.01) | |
| H01L 51/40 | (2006.01) | |
| H01L 51/00 | (2006.01) | |
| H01L 27/32 | (2006.01) | |
| H01L 51/56 | (2006.01) | |
| H01L 51/52 | (2006.01) | |
| H01L 51/50 | (2006.01) | |
| H01L 27/12 | (2006.01) | |

(52) U.S. Cl.
CPC ...... *H01L 51/5056* (2013.01); *H01L 51/5072* (2013.01); *H01L 51/5092* (2013.01); *H01L 51/525* (2013.01); *H01L 51/5206* (2013.01); *H01L 51/5221* (2013.01); *H01L 51/56* (2013.01); *H01L 27/3211* (2013.01); *H01L 27/3216* (2013.01); *H01L 2227/323* (2013.01); *H01L 2251/5315* (2013.01)

(58) Field of Classification Search
CPC ............. H01L 51/5072; H01L 51/5092; H01L 51/5206; H01L 51/5221; H01L 51/56
See application file for complete search history.

(56) References Cited

U.S. PATENT DOCUMENTS

| | | | | |
|---|---|---|---|---|
| 9,041,035 | B2* | 5/2015 | Lim | H01L 51/5281 |
| | | | | 257/98 |
| 9,466,650 | B2* | 10/2016 | Wang | H01L 51/0004 |
| 9,653,524 | B2* | 5/2017 | Kim | H01L 27/3246 |
| 9,722,005 | B2* | 8/2017 | Wang | H01L 51/56 |
| 10,325,970 | B2* | 6/2019 | Bang | H01L 27/3246 |
| 2013/0187163 | A1 | 7/2013 | Kim et al. | |
| 2014/0061605 | A1* | 3/2014 | Kim | G09G 3/3208 |
| | | | | 257/40 |
| 2014/0346468 | A1* | 11/2014 | Kim | H01L 27/3246 |
| | | | | 257/40 |
| 2014/0353595 | A1 | 12/2014 | Choi et al. | |
| 2015/0001474 | A1* | 1/2015 | Park | H01L 51/5271 |
| | | | | 257/40 |
| 2015/0194629 | A1 | 7/2015 | Liu et al. | |
| 2016/0056218 | A1* | 2/2016 | Wang | H01L 27/3246 |
| | | | | 257/40 |
| 2016/0254331 | A1 | 9/2016 | Wang | |
| 2017/0365649 | A1* | 12/2017 | Kim | H01L 51/56 |
| 2018/0331325 | A1* | 11/2018 | Zhang | H01L 51/5271 |

FOREIGN PATENT DOCUMENTS

| | | |
|---|---|---|
| CN | 103928497 A | 7/2014 |
| CN | 104218050 A | 12/2014 |
| CN | 104241329 A | 12/2014 |
| CN | 106449717 A | 2/2017 |
| EP | 1933393 A1 | 12/2006 |

* cited by examiner

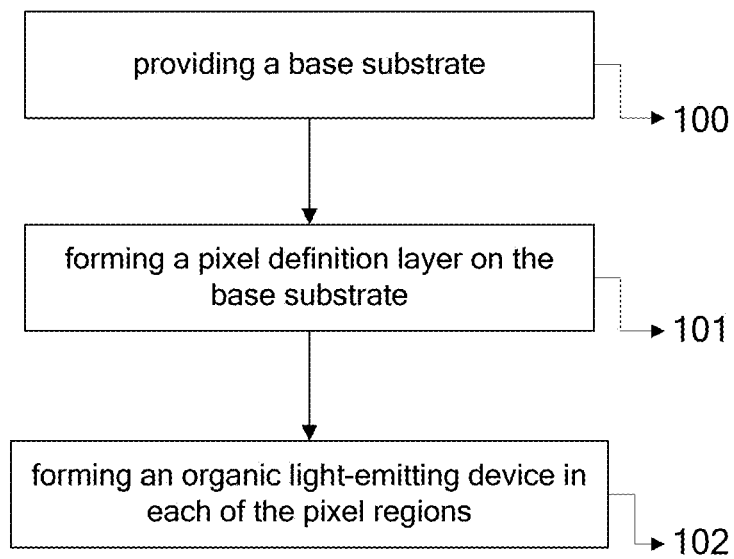
Fig. 7
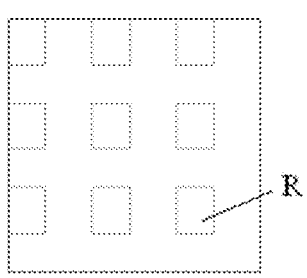 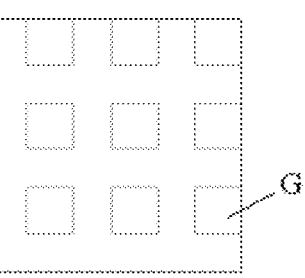 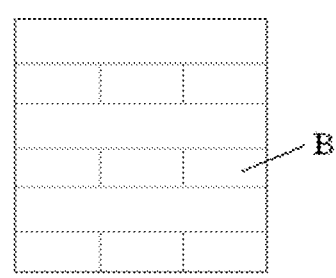
Fig. 8A      Fig. 8B      Fig. 8C

PIXEL DEFINITION LAYER HAVING AN INCLINE FOR AN ORGANIC LIGHT EMITTING DEVICE

TECHNICAL FIELD

Embodiments of the present disclosure relate to a substrate for an organic light-emitting device, a manufacturing method for a substrate for an organic light-emitting device, and an organic light-emitting display device.

BACKGROUND

An organic light-emitting diode (OLED) has unique characteristics such as self luminescence, rapid response, a variety of color, wide view angle, and capability of being manufactured on a flexible substrate. A display based on the OLED becomes a mainstream in a display field.

An OLED display backplane includes an array substrate and organic light-emitting devices, and each of the organic light-emitting devices includes an anode, an organic light-emitting layer and a cathode. The array substrate includes a driving circuit formed by using thin film transistors (TFTs). A pixel definition layer (PDL) is made at the array substrate to separate pixel regions from each other, for example, each of the pixel regions is an opening, and each opening is provided with one of the organic light-emitting devices. At present, the requirements for power consumption, efficiency, viewing angle and color cast in the display field is becoming more and more stringent. If the cathode of the organic light-emitting device is thin, the color cast is reduced, and at the same time when the light transmittance of the cathode is increased, the luminescence efficiency of the organic light-emitting device is improved.

SUMMARY

At least one embodiment of the present disclosure provides a substrate for an organic light-emitting device (namely, organic electroluminescent device), which includes: a base substrate; a pixel definition layer which is on the base substrate and which defines a plurality of pixel regions, each of the pixel regions having a top opening and a lower opening along a thickness direction of the base substrate, the lower opening being in the top opening so that each of the pixel regions has a slope from the top opening to the lower opening, and boundaries of the top openings adjacent to each other being intersected with each other; and an organic light-emitting device in each of the pixel regions.

For example, in the substrate for an organic light-emitting device provided by at least one embodiment of the present disclosure, the organic light-emitting device includes an anode in the lower opening of the pixel region, an organic light-emitting layer on the anode, and a cathode on the organic light-emitting layer.

For example, in the substrate for an organic light-emitting device provided by at least one embodiment of the present disclosure, the pixel definition layer is on the anode, and the anode is partially exposed by the lower opening in each of the pixel regions.

For example, in the substrate for an organic light-emitting device provided by at least one embodiment of the present disclosure, a slope angle of the slope of the pixel definition layer in each of the pixel regions ranges from 5 to 25 degrees.

For example, in the substrate for an organic light-emitting device provided by at least one embodiment of the present disclosure, cathodes of organic light-emitting devices in the pixel regions adjacent to each other are electrically connected to each other.

For example, in the substrate for an organic light-emitting device provided by at least one embodiment of the present disclosure, the organic light-emitting device is configured to emit at least one of red light, green light or blue light.

For example, the substrate for an organic light-emitting device provided by at least one embodiment of the present disclosure further includes spacers spaced apart from each other on the pixel definition layer.

For example, in the substrate for an organic light-emitting device provided by at least one embodiment of the present disclosure, the spacers are symmetrical with respect to a position of the boundaries of the top openings adjacent to each other.

For example, the substrate for an organic light-emitting device provided by at least one embodiment of the present disclosure further includes a driving circuit layer, the driving circuit layer includes driving transistors, and each of the driving transistors is electrically connected with the organic light-emitting device in each of the pixel regions correspondingly to drive the organic light-emitting device.

At least one embodiment of the present disclosure further provides an organic light-emitting display device, which includes the substrate for an organic light-emitting device described in any one of the above embodiments.

For example, the organic light-emitting display device provided by at least one embodiment of the present disclosure further includes an opposite substrate which is on the substrate for an organic light-emitting device.

At least one embodiment of the present disclosure further provides a manufacturing method of a substrate for an organic light-emitting device, which includes: providing a base substrate; forming a pixel definition layer on the base substrate, in which the pixel definition layer defines a plurality of pixel regions, each of the pixel regions has a top opening and a lower opening along a thickness direction of the base substrate, the lower opening is formed in the top opening so that each of the pixel regions has a slope extending from the top opening to the lower opening, and boundaries of the top openings adjacent to each other are intersected with each other; and forming an organic light-emitting device in each of the pixel regions.

For example, in the manufacturing method of a substrate for the organic light-emitting device provided by at least one embodiment of the present disclosure, the organic light-emitting device includes an anode formed in the lower opening of the pixel region, an organic light-emitting layer formed on the anode, and a cathode formed on the organic light-emitting layer.

For example, in the manufacturing method of a substrate for the organic light-emitting device provided by at least one embodiment of the present disclosure, the pixel definition layer is formed on the base substrate in an exposure mode with different gray scales, so that each of the pixel regions has the slope extending from the top opening to the lower opening.

For example, in the manufacturing method of a substrate for the organic light-emitting device provided by at least one embodiment of the present disclosure, the anode, the organic light-emitting layer, and the cathode of the organic light-emitting device are formed in turn in each of the pixel regions.

For example, in the manufacturing method of a substrate for the organic light-emitting device provided by at least one embodiment of the present disclosure, the organic light-emitting layer is formed by evaporating with an evaporation mask, and an opening of the evaporation mask is identical to or is substantially identical to the top opening of each of the pixel regions.

For example, in the manufacturing method of a substrate for the organic light-emitting device provided by at least one embodiment of the present disclosure, the organic light-emitting layer is an organic light-emitting layer configured to emitting red light, green light or blue light.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

FIG. 7 is a schematic flow chart of a manufacturing method of a substrate for an organic light-emitting device provided by at least one embodiment of the present disclosure;

FIG. 8A to FIG. 8C are schematic views of structures of pixel masks provided by at least one embodiment of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "on," "under," "right," "left" and the like are only used to indicate relative position relationship, and when the position of the object which is described is changed, the relative position relationship may be changed accordingly.

A method for manufacturing a pixel definition layer (PDL) which defines an opening region of a pixel region includes forming a relatively regular hole in the pixel definition layer at a position corresponding to the pixel region according to the shape of the pixel region. In the display industry, with higher and higher requirements for visual angle and color cast, and at the same time in order to obtain a higher luminous efficiency, a thickness of a cathode of an organic light-emitting device in the opening region is required to be thinner, which raises new requirements for the shape of the opening region of the pixel definition layer.

Figure 1A:
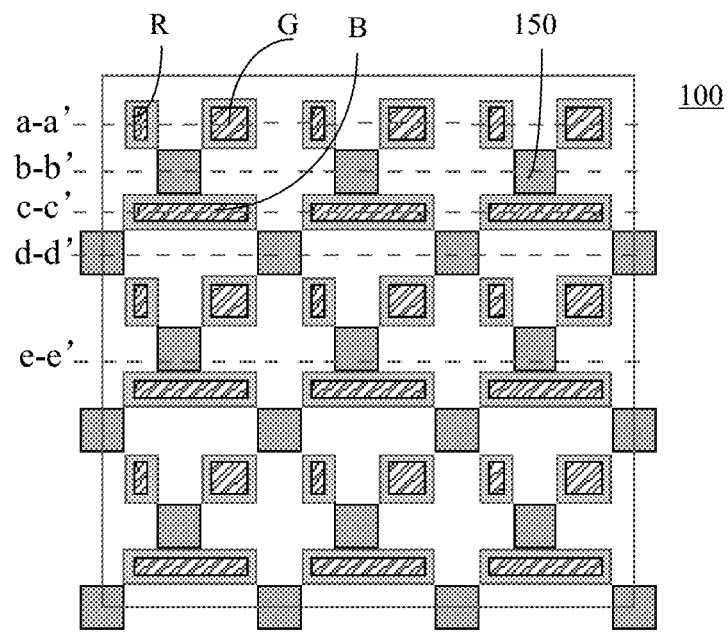
FIG. 1A is a schematic structural view of a pixel definition layer of a substrate for an organic light-emitting device.
Figure 1B:
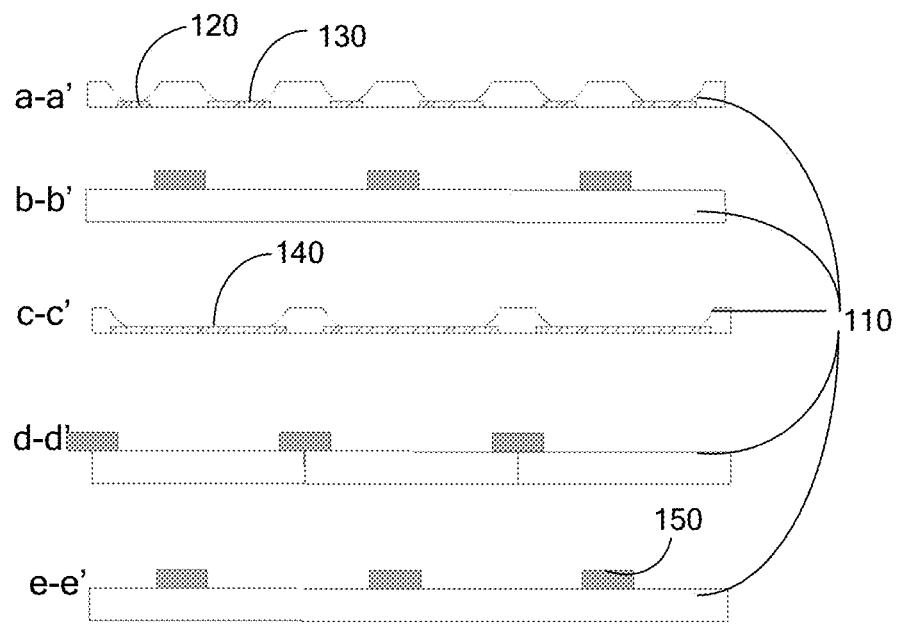
FIG. 1B is a schematic section view of different portions of the substrate for the organic light-emitting device as illustrated in FIG. 1A.

FIG. 1A is a schematic structural view of a pixel definition layer of a substrate for an organic light-emitting device, FIG. 1B is a schematic section view of different portions of the substrate for an organic light-emitting device as illustrated in FIG. 1A. The section views of a-a', b-b', c-c', d-d' and e-e' in FIG. 1B are cross sections of the pixel defining layer of FIG. 1A along the lines a-a', b-b', c-c', d-d' and e-e', respectively.

As illustrated in FIG. 1A, the substrate for the organic light-emitting device 100 includes a plurality of pixel regions arranged in an array (so the substrate for an organic light-emitting device is an array substrate), and the pixel regions include the pixel regions for forming red sub pixels (R), green sub pixels (G) and blue sub pixels (B). As illustrated in FIG. 1B, the pixel definition layer 110 has opening regions respectively corresponding to the pixel regions, and in the opening regions in FIG. 1B, there are anodes 120, 130 and 140 of organic light-emitting devices corresponding to the red sub pixels (R), the green sub pixels (G) and the blue sub pixels (B), respectively.

Each of the opening regions of the pixel definition layer 110 respectively corresponding to the pixel regions has a top opening and a lower opening along a thickness direction of the base substrate; boundaries of the top openings of the pixel regions adjacent to each other have a certain distance from each other, so the top openings occupy a small region of the substrate for an organic light-emitting device, which results in the slope gradient from the top opening to the lower opening in the pixel region defined by the pixel definition layer 110 is steep. A platform portion is formed between the top openings of the pixel regions adjacent to each other, and spacers 150 are formed on the platform portion between the top openings in the pixel regions adjacent to each other.

An organic light-emitting layer and a cathode are further formed on the substrate for an organic light-emitting device with the pixel definition layer. For example, organic light-emitting layers of the organic light-emitting devices for emitting light of different colors are formed by the method of evaporation. For example, a common cathode of the organic light-emitting devices extends over the whole substrate for the organic light-emitting device. If the common cathode is too thin, the phenomenon that a film of the common cathode is broken or discontinuous occurs, which causes bad overlap of the common cathode on the pixel definition layer and an increased resistance of the common cathode, then the efficiency and power consumption of the organic light-emitting devices are reduced, or even an opening circuit is caused directly, so that a display device including the organic light-emitting devices cannot be lighted, and thus the display function cannot be realized normally.

Figure 2A:
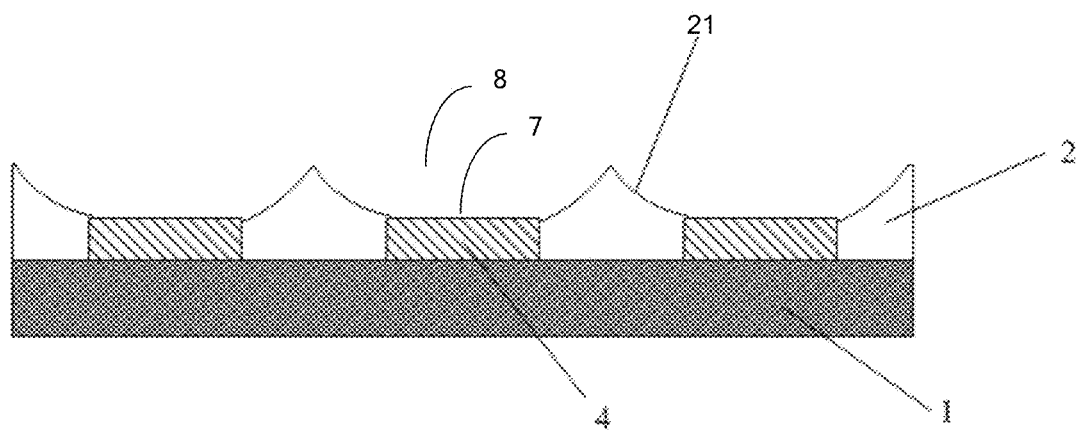
FIG. 2A is a schematic section view of a portion of a structure of a substrate for an organic light-emitting device provided by at least one embodiment of the present disclosure.

At least one embodiment of the present disclosure provides a substrate for an organic light-emitting device (namely a substrate for an organic electroluminescent device). FIG. 2A is a schematic structural view of the substrate for an organic light-emitting device provided by at least one embodiment of the present disclosure. As illustrated in FIG. 2A, the substrate for the organic light-emitting device includes: a base substrate 1; a pixel definition layer 2 disposed on the base substrate 1, and an organic light-emitting device (not illustrated in FIG. 2A) disposed in each of pixel regions defined by the pixel definition layer 2.

For example, as illustrated in FIG. 2A, the pixel definition layer defines a plurality of pixel regions, the plurality of pixel regions are distributed in an array. Light emitted from the plurality of pixel regions respectively has the same color or different colors. Each of the opening regions in the pixel definition layer 2 respectively corresponding to the pixel regions has a top opening 8 and a lower opening 7 along a thickness direction of the base substrate 1, and the lower opening 7 is formed in the top opening 8 so that each of the pixel regions has a slope 21 extending from the top opening 8 to the lower opening 7, and boundaries of the top openings 8 of the pixel regions adjacent to each other are intersected with each other, that is the boundaries of the top openings 8 adjacent to each other overlap with each other, and therefore there is no planar portion or substantially no planar portion between the boundaries of the top openings adjacent to each other. At least a portion of a projection of the lower opening 7 on a plane where the base substrate 1 is located and a projection of the top opening 8 on the plane where the base substrate 1 is located do not overlap with each other, so that the lower opening 7 is formed in the top opening 8.

Figure 2B:
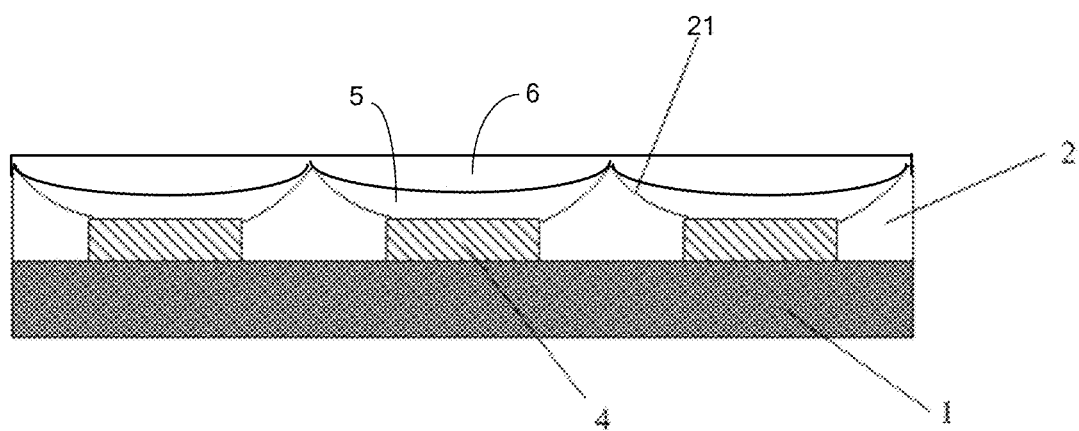
FIG. 2B is a schematic section view of the structure of the substrate for an organic light-emitting device provided by at least one embodiment of the present disclosure.

It should be noted that, the top opening 8 of the slope 21 of the pixel definition layer is an opening in a portion, away from the base substrate 1, of the pixel definition layer 2; the lower opening 7 is an opening, in a portion, close to the base substrate 1, of the pixel definition layer 2; and the top opening 8 is connected with the lower opening 7 of the pixel definition layer 2 by the slope 21. For example, FIG. 2B is a schematic section view of a structure of the substrate for an organic light-emitting device provided by at least one embodiment of the present disclosure. As illustrated in FIG. 2B, in each of the pixel regions, the organic light-emitting device includes an anode 4 disposed in the lower opening 7 of the pixel region, an organic light-emitting layer 5 disposed on the anode 4, and a cathode 6 disposed on the organic light-emitting layer 5. For example, the organic light-emitting layer 5 is formed in a pixel region defined by the pixel definition layer 2, and the cathode 6, for example, a common cathode, is shared by a plurality of pixel regions adjacent to each other, so that the cathode 6 crosses the boundaries of the pixel regions adjacent to each other and covers the slope 21 of the pixel definition layer 2 in the pixel region. In addition, in other examples, the organic light-emitting device includes a cathode, an organic light-emitting layer 5 and an anode 4 formed on the base substrate 1 in sequence, and in the present example, the anode 4 is formed on the pixel definition layer 2, for example, the anode 4 is a common anode which covers the pixel regions adjacent to each other.

For example, the base substrate 1 is a glass substrate, a silicon substrate, or a quartz substrate, or the like. Moreover, for example, a driving circuit layer (not shown) is formed on the base substrate 1, which is configured to apply a driving voltage to the above organic light-emitting device to make the organic light-emitting device emit light. The pixel definition layer 2, and the organic light-emitting device, etc. are formed on the driving circuit layer, in this way, the driving circuit layer may be considered as a portion of the base substrate 1. The driving circuit layer for the pixel regions includes gate lines, data lines, power lines, transistors and storage capacitors, etc. The transistors, for example, are thin film transistors, and are used as switch transistors or driving transistors or the like to drive the corresponding organic light-emitting devices respectively. For example, one of a source electrode and a drain electrode of the driver transistor is connected with the anode of the organic light-emitting device.

The substrate for an organic light-emitting device in the embodiments of the present disclosure makes the thin electrode (such as the cathode) formed on the pixel definition layer overlap the pixel definition layer well, so that the transmittance of light is improved.

Figure 3A:
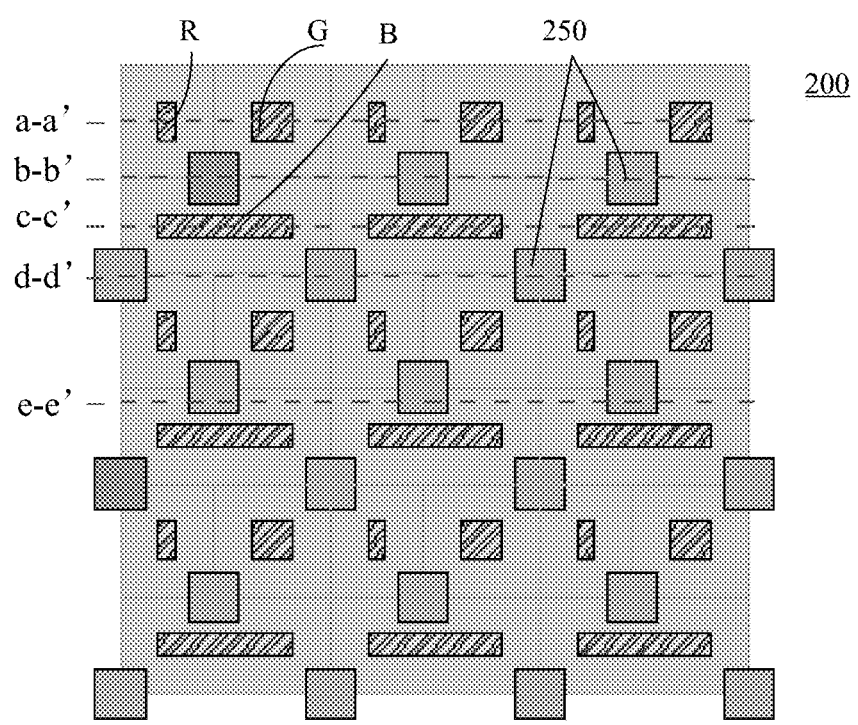
FIG. 3A is a schematic structural view of a pixel definition layer of the substrate for an organic light-emitting device provided by at least one embodiment of the present disclosure.
Figure 3B:
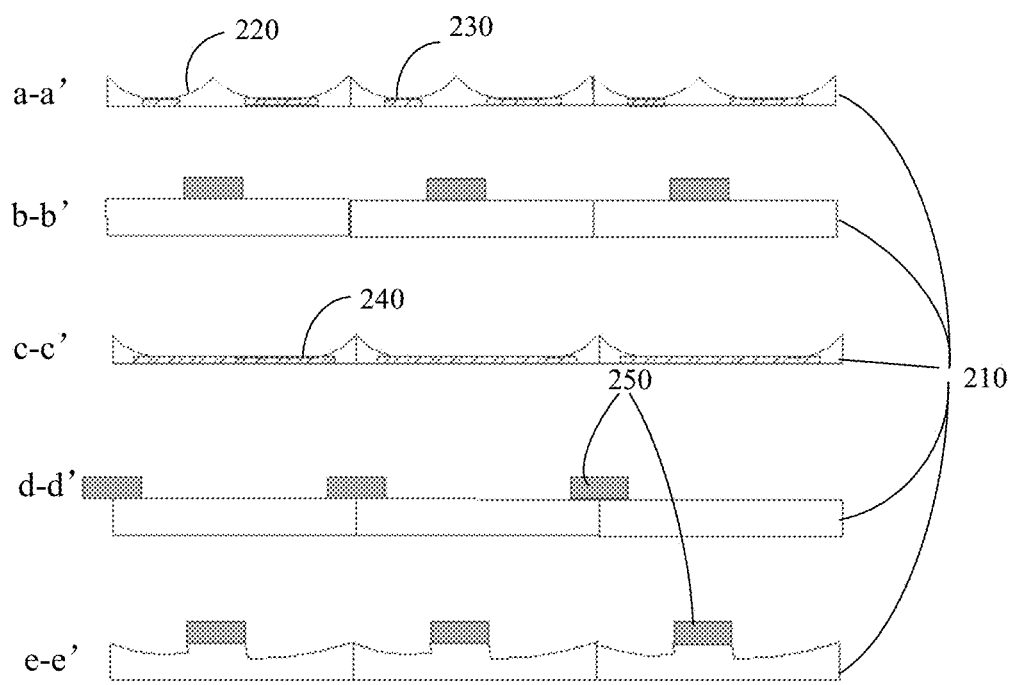
FIG. 3B is a structural section view of different portions of the substrate for an organic light-emitting device as illustrated in FIG. 3A.

At least one embodiment of the present disclosure further provides a substrate for an organic light-emitting device 200, FIG. 3A is a schematic structural view of a pixel definition layer of the substrate for an organic light-emitting device 200 provided by at least one embodiment of the present disclosure, FIG. 3B is a section view of different portions of the substrate for an organic light-emitting device as illustrated in FIG. 3A, and the section views of a-a', b-b', c-c', d-d' and e-e' in FIG. 3B are the cross sections of the pixel defining layer of FIG. 3A along the lines a-a', b-b', c-c', d-d' and e-e', respectively.

As illustrated in FIG. 3A and FIG. 3B, the substrate for an organic light-emitting device 200 includes a base substrate 1, a pixel definition layer 210 formed on the base substrate 1, and an organic light-emitting device formed in each pixel region defined by the pixel definition layer 210. FIG. 3A and FIG. 3B only show the anodes of the organic light-emitting devices. The pixel definition layer 210 defines a plurality of pixel regions, and the plurality of pixel regions are arranged in an array. Light respectively emitted from the plurality of pixel regions are of different colors. For example, the plurality of pixel regions include red sub (R) pixel regions, green (G) sub pixel regions and blue (B) sub pixel regions. There are anodes 220, 230 and 240 of the organic light-emitting devices corresponding to the red (R) sub pixels, the green (G) sub pixels and the blue (B) sub pixels, respectively. For example, a red (R) sub pixel, a green (G) sub pixel and a blue (B) sub pixel which are adjacent to each other form a pixel, and they are arranged in a "品" word (or arranged in a triangle).

The substrate for an organic light-emitting device further includes spacers 250 arranged on the pixel definition layer 210, and the spacers 250 are arranged between the pixel regions adjacent to each other. For example, the spacers adjacent to each other are symmetrically arranged with respect to the boundaries of the top opening regions of the pixel regions adjacent to each other.

Figure 4:
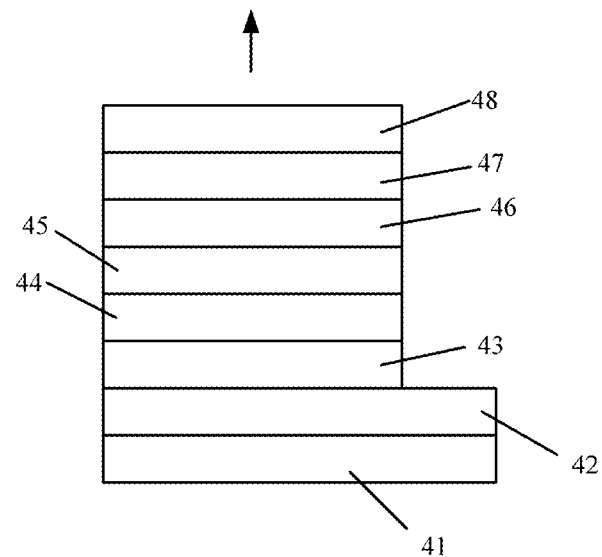
FIG. 4 is a schematic structural view of an upright top-emitting OLED device provided by at least one embodiment of the present disclosure.

For example, the organic light-emitting device is a top-emitting OLED device, for example an upright top-emitting OLED (namely the anode of the OLED is between the cathode of the OLED device and the base substrate and the cathode side is the light-emitting side of the OLED device). FIG. 4 is a schematic structural view of an upright top-emitting OLED device provided by at least one embodiment of the present disclosure. As illustrated in FIG. 4, the upright top-emitting OLED device includes a base substrate 41, an anode 42, a hole injection layer 43, a hole transport layer 44, an organic light-emitting layer 45, an electron transport layer 46, an electron injection layer 47 and a cathode 48. For example, reflected light is emitted from a side of the cathode in a direction opposite to the direction of the base substrate 1.

For example, the pixel definition layer 210 is disposed on the anodes 220, 230, 240, so that the anodes 220, 230, 240 are partially exposed by the corresponding lower openings in the pixel regions defined by the pixel definition layer 210, respectively. As illustrated in section views respectively along a-a' and c-c' in FIG. 3B, each of the anodes is exposed by a corresponding lower opening. For example, a top-emitting OLED device is achieved by arranging a transparent cathode layer and a reflective anode layer. In other embodiments of the present disclosure, for example, the organic light-emitting device is a bottom-emitting OLED. For example, the bottom-emitting OLED is achieved by arranging a transparent anode layer and a reflective cathode layer, and the base substrate is transparent.

According to the different structures of the OLED device, different anode materials and cathode materials are selected. For example, the anode material is indium tin oxide (ITO), Ag, NiO, Al, ZnO, AZO (AlZnO), graphene and other transparent or translucent material with a high work function, a good electrical conductivity and a good chemical stability. For example, a thickness of the anode is from 1 micron to 2 micron (μm). For example, the cathode material is a metal or an alloy material with a low work function. In order to overcome the high chemical activity of the metal with low work function such as calcium, potassium and lithium and the like, for example, the cathode material is an alloy made of metal with low work function and corrosion-resistant metal, such as MgAg (90 at % Mg, 3.7 eV), or LiAl (0.6 at % Li, 3.2 eV), or the like.

For example, the thickness of the pixel definition layer 210 is from 1.5 micron to 3 micron. For example, the material of the pixel definition layer 210 is an inorganic material (e.g. silicon nitride or silicon oxide) or an organic material (e.g., polyimide, or polytetrafluoroethylene (PTFE)), or a photoresist (such as polyvinyl lauric acid ester, Kodak Photo Resist (KPR), or Kodak orthoresist (KOR)), which is not limited in the embodiments of the present disclosure.

For example, the cathodes of the organic light-emitting devices respectively in the pixel regions adjacent to each other are electrically connected to each other. For example, the cathodes of the organic light-emitting devices form a common cathode layer on the whole substrate for the organic light-emitting device or a portion region of the substrate for an organic light-emitting device.

For example, the substrate for an organic light-emitting device includes at least one of the red pixel, the green pixel, or the blue pixel. For example, the red sub pixel R, the green sub pixel G and the blue sub pixel B include the red sub pixel anode 220, the green sub pixel anode 230 and the blue sub pixel anode 240 respectively. For example, the sizes, the shapes and the positions of the red pixel anode 220, the green sub pixel anode 230 and the blue sub pixel anode 240 can be arranged according to the requirements, which is not limited herein.

As illustrated in FIG. 3A, the red sub pixel R, the green sub pixel G, and the blue sub pixel B are arranged to be in rectangular shapes having different sizes respectively, and have the same number. As illustrated in section views along a-a' and c-c' in FIG. 3B, according to the different sizes and shapes of the anodes 4 of the pixels, the sizes of the lower openings respectively corresponding to the pixels are different and the sizes of the top openings respectively corresponding to the pixels are also different.

FIG. 3A illustrates by taking a structure that the organic light-emitting devices include the sub pixels with different colors and the same quantities as an example, and the embodiments of the present disclosure are not limited to this. For example, the structure of the organic light-emitting devices in practical application can adopt any other suitable arrangement to realize a color display.

For example, the substrate for the organic light-emitting device further includes spacers 250 spaced apart from each other on the pixel definition layer 210. The spacers 250, for example, used for supporting an opposite substrate on the substrate for the organic light-emitting device in the display device. For example, the spacers adjacent to each other are arranged symmetrically with respect to a position of the boundaries of the top openings adjacent to each other, and each row of the spacers is between two adjacent rows of the pixel regions. As illustrated in FIG. 3A, the spacers 250 are spaced apart from each other and are evenly arranged at junction positions of the pixel region provided with the red sub pixel R, the pixel region provided with the green sub pixel G, and the pixel region provided with the blue sub pixel B which are adjacent to each other, respectively. As illustrated in section views along b-b' and d-d' in FIG. 3B, each of the lines b-b' and d-d' is a center line connecting centers of a row of the spacers 250 and a line connecting the boundaries of the top openings adjacent to each other, so the top surface of the pixel definition layer 210 corresponding to the row of the spacers 250 is planar, and the spacers 250 at the line b-b' and the spacers 250 at the line d-d' are at different rows. The line e-e' illustrates portions of the spacers 250 respectively in the openings, so the upper surface of the pixel definition layer 210 is not planar.

A slope angle of the opening region in the pixel definition layer of the present embodiments is explained below in connection with FIG. 6. For example, the slope angle of the slope 21 between the top opening and the lower opening in each of the pixel regions of the pixel definition layer ranges from 5 to 25 degrees.

For example, the slope angle of the slope is 5 degrees, 10 degrees, 15 degrees, 20 degrees or 25 degrees.

For example, in the embodiments of the present disclosure, the slope 21 is an inclined conical surface or an internal concave surface. The slope angle of the slope 21 refers to the angle between a surface of the slope 21 or a tangent plane of the slop 21 and a horizontal plane (that is an upper surface of the base substrate 1). It should be noted that, if the slope 21 is formed by extending a smooth curved surface, the slope angle is the angle between the tangent plane of the slope 21 and the upper surface of the base substrate 1.

Figure 5:
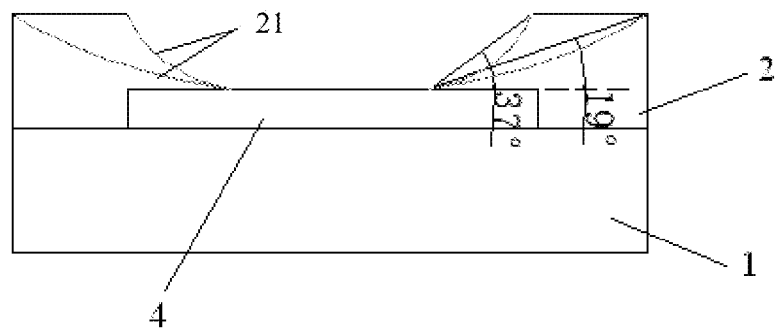
FIG. 5 is a schematic view of a slope angle of an opening region of the pixel definition layer provided by at least one embodiment of the present disclosure.

As illustrated in FIG. 5, the top opening of the pixel definition layer 110 illustrated in FIG. 1 is small, so the slope angle of the slope 21 (the inside curve) connecting the top opening with the lower opening is large. For example, a refers to the slope angle of the slope 21, for example, the slope angle $\alpha$ is 37 degrees. In the present embodiment of the present disclosure as illustrated in FIG. 3, the boundaries of the top openings of the adjacent pixel regions in the pixel definition layer 210 are overlapped with each other, so that the top opening is largest, so the slope angle of the slope 21 (the outside curve) connecting the top opening with the lower opening is small. For example, $\beta$ refers to the slope angle of the slope 21, for example, the slope angle $\beta$ is 19 degrees. For example, the top opening and the lower opening of the pixel definition layer form a gentle slope, so as to ensure the requirements for evaporation for, for example, the organic light-emitting layer (and for example, the hole injection layer, a hole transport layer), and at the same time to obtain a lager evaporation surface (the surface of the slope), because the larger the evaporation surface, the more conducive to the thin cathode to attach on the slope. Therefore, the quality of the formed film is further improved, and the performance of the organic light-emitting device is further improved.

The substrate for an organic light-emitting device in the embodiments of the present disclosure makes the thin electrode (such as a cathode) formed on the pixel definition layer have a better overlapping effect, so that the transmittance of light is improved.

Figure 6:
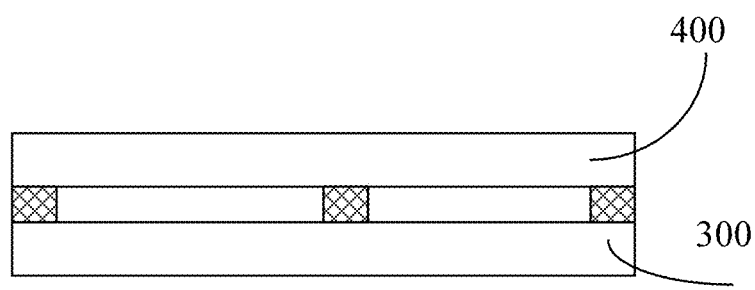
FIG. 6 is a schematic view of an organic light-emitting display device provided by at least one embodiment of the present disclosure.

At least one embodiment of the present disclosure further provides an organic light-emitting display device, as illustrated in FIG. 6, the organic light-emitting display device includes the substrate for an organic light-emitting device 300 described in any one of the above embodiments. For example, the organic light-emitting display device includes an opposite substrate 400, and the opposite substrate 400 is arranged on the substrate for an organic light-emitting device 300. For example, the substrate for the organic light-emitting device and the opposite substrate are connected by a sealant to form a cell. For example, the opposite substrate 400 includes a glass substrate. In the practical application, the organic light-emitting display device can be a mobile phone, a TV, a computer, a dashboard, and so on.

Because the organic light-emitting display device includes the substrate for an organic light-emitting device in any one of the above embodiments, the technical effect of the organic light-emitting display device is the same as that of the substrate for the organic light-emitting device, which is omitted herein.

At least one embodiment of the present disclosure further provides a manufacturing method of a substrate for an organic light-emitting device. FIG. 7 is a schematic flow chart of the manufacturing method for the substrate of an organic light-emitting device provided by at least one embodiment of the present disclosure. As illustrated in FIG. 7, the method for manufacturing the substrate for an organic light-emitting device includes the following operations.

Step 100: providing a base substrate;

Step 101: forming a pixel definition layer on the base substrate, in which the pixel definition layer defines a plurality of pixel regions, each of the pixel regions has a top opening and a lower opening along a thickness direction of the base substrate, the lower opening is formed in the top opening so that each of the pixel regions has a slope extending from the top opening to the lower opening, and boundaries of the top openings adjacent to each other are intersected with each other.

Step 102: forming an organic light-emitting device in each of the pixel regions.

For example, the organic light-emitting device includes an anode disposed in the lower opening of the pixel region, an organic light-emitting layer disposed on the anode, and a cathode disposed on the organic light-emitting layer.

The obtained substrate for an organic light-emitting device is the substrate for an organic light-emitting device as illustrated in FIG. 2B. Its specific structures, such as the base substrate, the anode, the organic light-emitting layer and the cathode, are similar to the corresponding characteristic structures described above and the realization principles are the same, which is omitted herein.

For example, the method for manufacturing the pixel definition layer is a chemical vapor deposition (CVD) method, a spin coating method, or a scraping coating method, etc., which is not limited in the embodiments of the present disclosure, and it is necessary to choose the material based on the film to be formed. For example, an inorganic material or an organic material is selected. In a case that the pixel definition layer is made of the organic material, for example, the pixel definition layer is made of photoresist.

For example, a pixel definition layer is formed on an insulated substrate by using a plurality of masks with different gray scales in turn, so that the pixel region has the slope extending from the top opening to the lower opening. For example, a patterning process for forming the slope extending from the top opening to the lower opening at least includes the processes of exposure, development and etching (wet etching or dry etching).

For example, in a case of using the photoresist to prepare the pixel definition layer, the method of exposure by using the plurality of masks with different gray scales can be used, so that in a pixel region, the degree for exposing the pixel definition layer from a lower opening position to a top opening position is gradually changed. After the exposed photoresist is developed, the pixel definition layer required by the present embodiments of the present disclosure is obtained.

For example, forming the organic light-emitting device includes forming the anode, the organic light-emitting layer, and the cathode in turn. For example, the anode is formed on the base substrate firstly, and then the pixel definition layer is formed on the base substrate, after that, for example, the organic light-emitting layer is formed in an ink jet printing method. For example, if an organic functional layer is required to be formed, the organic functional layer, such as a hole injection layer, a hole transport layer, an electronic transport layer and an electronic injection layer are also formed in an ink jet printing method. Finally, the cathode is deposited on the organic light-emitting layer, and so on. For example, the cathode is formed firstly, and the anode and other structures of the organic light-emitting device are formed after the pixel definition layer is formed.

For example, the organic light-emitting layer is evaporated by an evaporation mask, and a size of an opening in the evaporation mask is the same as or substantially the same as a size of the top opening of the pixel region in the pixel definition layer.

For example, the substrate for an organic light-emitting device manufactured by an embodiment of the present disclosure includes red sub pixels, green sub pixels, or blue sub pixels. FIG. 8A to FIG. 8C are schematic views of structures of three evaporated masks for forming the substrate for the organic light-emitting device as illustrated in FIG. 3A and FIG. 3B provided by at least one embodiment of the present disclosure. The positions of the openings of the masks in FIG. 8A, FIG. 8B and FIG. 8C correspond to the top openings in different pixel regions of the pixel definition layer respectively, that is the red sub pixel mask R corresponds to the red sub pixel, the green sub pixel mask G corresponds to the green sub pixel, and the blue sub pixel mask B corresponds to the blue sub pixel.

For example, the top openings of the pixels with different colors in the pixel definition layer and the openings of the corresponding evaporated masks are matched in size and shape. Therefore, the design and arrangement of the evaporated masks take up almost all the light-emitting regions. That is to say, the surface area of the top openings of the pixel definition layer is maximized, and the angles of the slopes are slowed down. Moreover, because the top openings of the pixel definition layer correspond to the openings of the evaporation mask respectively, the blocking of the evaporation mask is reduced and thus the cleaning times of the evaporation mask is reduced.

In practical applications, in evaporating the organic material layers (organic light-emitting layers or organic functional layers) of red sub pixels, green sub pixels and blue sub pixels, a high precision alignment system can be used to make the mask aligned with the base substrate.

Figure 9:
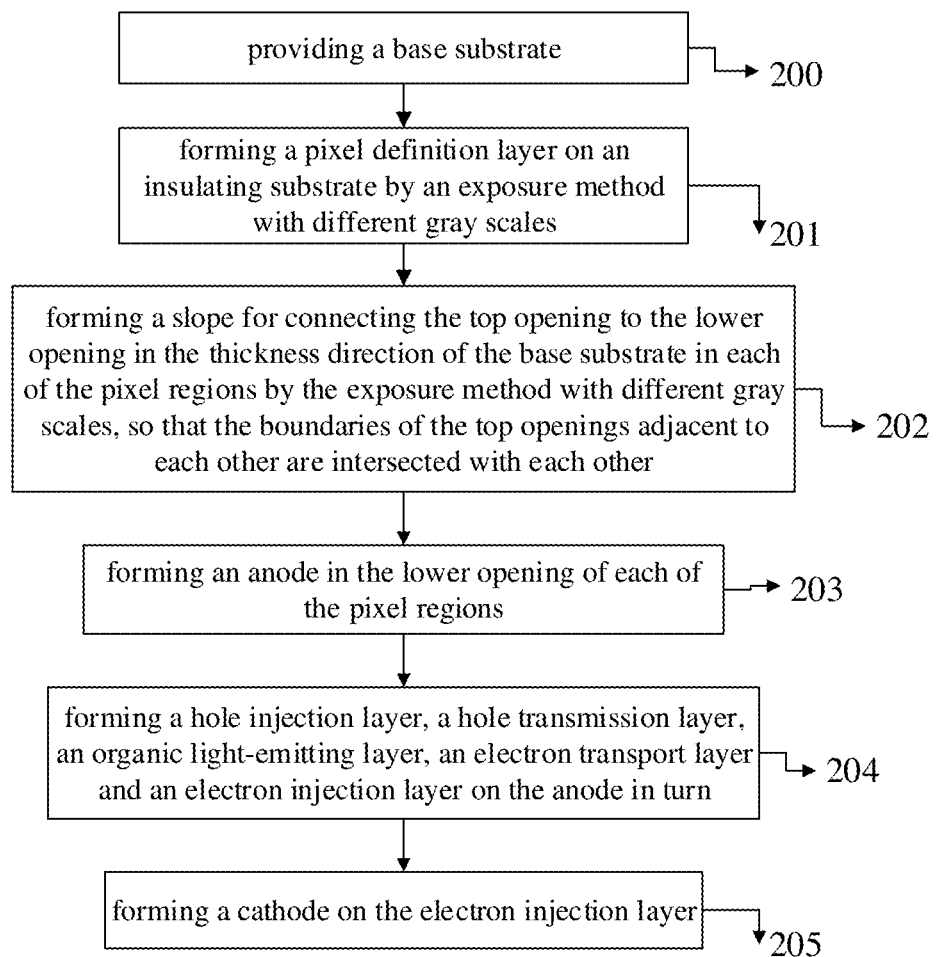
FIG. 9 is a schematic flow chart of the manufacturing method of the substrate for an organic light-emitting device provided by at least one embodiment of the present disclosure.

FIG. 9 is a flow chart of the manufacturing method of the substrate for the organic light-emitting device provided by at least one embodiment of the present disclosure. As illustrated in FIG. 9, on the basis of the manufacturing method of the substrate for an organic light-emitting device shown in FIG. 7, the manufacturing method of the substrate for the organic light-emitting device includes the following operations.

Step 200: providing a base substrate.

Step 201: forming a pixel definition layer on an insulating substrate by an exposure method with different gray scales.

Step 202: forming a slope for connecting the top opening to the lower opening in the thickness direction of the base substrate in each of the pixel regions by the exposure method with different gray scales, so that the boundaries of the top openings adjacent to each other are intersected with each other.

Step 203: forming an anode in the lower opening of each of the pixel regions.

Step 204: forming a hole injection layer, a hole transmission layer, an organic light-emitting layer, an electron transport layer and an electron injection layer on the anode in turn.

Step 205: forming a cathode on the electron injection layer.

The substrate for an organic light-emitting device provided by the embodiment of the present disclosure may be the substrate for an organic light-emitting device in the embodiments shown in FIG. 3A and FIG. 3B, its specific structures, such as the base substrate, the anode, the organic light-emitting layer and the cathode, are similar to the corresponding characteristic structures mentioned above, and their implementation principles are the same, which are not limited herein.

There are the following points to be noted.

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale. It should be understood that: in a case that an element such as a layer, a film, a region or a substrate is referred to as being disposed "on" or "beneath" another element, the element may be "directly" disposed "on" or "beneath" another element, or an intermediate element may be provided.

(3) In the absence of conflict, the embodiments of the present disclosure and the features in the embodiments can be combined with each other to obtain new embodiments.

What are described above is related to the illustrative embodiments of the disclosure only and not limitative to the scope of the disclosure. Therefore, the scopes of the disclosure are defined by the accompanying claims.

The present application claims the priority of the Chinese Patent Application No. 201610999302.3 filed on Nov. 14, 2016, the entirety of which is incorporated herein by reference as a part of the present application.

What is claimed is:

1. A substrate for an organic light-emitting device, comprising:
a base substrate;
a pixel definition layer on the base substrate, wherein the pixel definition layer defines a plurality of pixel regions, the pixel definition layer comprises a top opening and a lower opening along a thickness direction of the base substrate corresponding to each of the pixel regions, the lower opening is in the top opening so that the pixel definition layer comprises a slope extending from the top opening to the lower opening corresponding to each of the pixel regions, and boundaries of the top openings adjacent to each other are straight lines;
an organic light-emitting device in each of the pixel regions; and
spacers spaced apart from each other on the pixel definition layer,
wherein the slope extending from one of the boundaries to the lower opening corresponding to each of the pixel regions protrudes toward the base substrate, and is in a shape of a smooth arc; and tangents of the smooth arc have a slope which gradually decreases in absolute value from the one of the boundaries to the lower opening;
a first portion of the pixel definition layer has a flat surface which is directly contacted with the spacers; and
a second portion of the pixel definition layer is the boundaries of the top openings intersected with each other and between two adjacent spacers.

2. The substrate for an organic light-emitting device according to claim 1, wherein the organic light-emitting device comprises an anode, an organic light-emitting layer and a cathode, the pixel definition layer is on the anode, and the anode is partially exposed by the lower opening in each of the pixel regions.

3. The substrate for an organic light-emitting device according to claim 2, wherein cathodes of organic light-emitting devices in the pixel regions adjacent to each other are electrically connected to each other.

4. The substrate for an organic light-emitting device according to claim 2, wherein a slope angle of the slope of the pixel definition layer in each of the pixel regions ranges from 5 degrees to 25 degrees.

5. The substrate for an organic light-emitting device according to claim 2, wherein a slope angle of the slope of the pixel definition layer in each of the pixel regions ranges from 5 degrees to 25 degrees.

6. The substrate for an organic light-emitting device according to claim 1, wherein a slope angle of the slope of the pixel definition layer corresponding to in each of the pixel regions ranges from 5 degrees to 25 degrees.

7. The substrate for an organic light-emitting device according to claim 1, wherein the organic light-emitting device is configured to emit at least one of red light, green light or blue light.

8. The substrate for an organic light-emitting device according to claim 1, wherein the spacers are symmetrical with respect to positions of the boundaries of the top openings adjacent to each other.

9. The substrate for an organic light-emitting device according to claim 1, further comprising a driving circuit layer, wherein the driving circuit layer comprises driving transistors, and each of the driving transistors is electrically connected with the organic light-emitting device in each of the pixel regions correspondingly to drive the organic light-emitting device.

10. An organic light-emitting display device, comprising the substrate for an organic light-emitting device according to claim 1.

11. The substrate for an organic light-emitting device according to claim 2, wherein the organic light-emitting device is configured to emit at least one of red light, green light or blue light.

12. A manufacturing method of a substrate for an organic light-emitting device, comprising:
providing a base substrate;
forming a pixel definition layer on the base substrate, wherein the pixel definition layer defines a plurality of pixel regions, the pixel definition layer comprises a top opening and a lower opening along a thickness direction of the base substrate corresponding to each of the pixel regions, the lower opening is formed in the top opening so that the pixel definition layer comprises a slope extending from the top opening to the lower opening corresponding to each of the pixel regions, and boundaries of the top openings adjacent to each other are straight lines;
forming an organic light-emitting device in each of the pixel regions;
forming spacers spaced apart from each other on the pixel definition layer,
wherein the slope extending from one of the boundaries to the lower opening corresponding to each of the pixel regions protrudes toward the base substrate, and is in a shape of a smooth arc; and tangents of the smooth arc have a slope which gradually decreases in absolute value from the one of the boundaries to the lower opening;
a first portion of the pixel definition layer has a flat surface which is directly contacted with the spacers;
a second portion of the pixel definition layer is the boundaries of the top openings intersected with each other and between two adjacent spacers.

13. The manufacturing method according to claim 12, wherein the organic light-emitting device comprises an anode, an organic light-emitting layer and a cathode, the pixel definition layer is on the anode, and the anode is partially exposed by the lower opening in each of the pixel regions.

14. The manufacturing method according to claim 13, wherein the anode, the organic light-emitting layer, and the cathode of the organic light-emitting device are formed in this order in each of the pixel regions.

15. The manufacturing method according to claim 12, wherein the pixel definition layer is formed on the base substrate in an exposure mode by using a plurality of masks with different gray scales, so that each of the pixel regions comprises the slope extending from the top opening to the lower opening.

16. The manufacturing method according to claim 12, wherein an anode, an organic light-emitting layer, and a cathode of the organic light-emitting device are formed in this order in each of the pixel regions.

17. The manufacturing method according to claim 16, wherein the organic light-emitting layer is formed by evaporating with an evaporation mask, and an opening of the evaporation mask is identical to or is substantially identical to the top opening of each of the pixel regions.

* * * * *